United States Patent
Cox et al.

(10) Patent No.: US 6,168,459 B1
(45) Date of Patent: Jan. 2, 2001

(54) FLEX SUPPORT AND SEAL APPARATUS FOR A DISC DRIVE

(75) Inventors: Alvin E. Cox, Yukon; Steven S. Eckerd; Housan Dakroub, both of Oklahoma City, all of OK (US)

(73) Assignee: Seagate Technology LLC, Scotts Valley, CA (US)

( * ) Notice: Under 35 U.S.C. 154(b), the term of this patent shall be extended for 0 days.

(21) Appl. No.: 09/303,206

(22) Filed: Apr. 30, 1999

Related U.S. Application Data (60) Provisional application No. 60/089,347, filed on Jun. 15, 1998, and provisional application No. 60/089,344, filed on Jun. 15, 1998.

(51) Int. Cl.[7] .................................................. H01R 12/24
(52) U.S. Cl. ...................... 439/495; 360/97.01; 439/559; 439/926
(58) Field of Search .............................. 439/77, 495, 496, 439/559, 926; 360/97.01, 97.02

(56) References Cited

U.S. PATENT DOCUMENTS

| | | | |
|---|---|---|---|
| 3,366,919 | * | 1/1968 | Gammel, Sr. et al. .............. 439/495 |
| 4,752,244 | | 6/1988 | Kuhl et al. . |
| 4,752,246 | | 6/1988 | Triner et al. . |
| 4,755,147 | | 7/1988 | Young . |
| 5,083,939 | * | 1/1992 | Ittah ...................................... 439/496 |
| 5,337,202 | | 8/1994 | Jabbarai et al. ................... 360/97.01 |
| 5,357,386 | * | 10/1994 | Haidari et al. ..................... 360/97.02 |
| 5,403,202 | | 4/1995 | Roehling . |
| 5,541,787 | | 7/1996 | Jabbari et al. ..................... 360/97.01 |
| 5,659,213 | | 8/1997 | Ismashiro et al. ................. 360/98.07 |
| 5,717,541 | | 2/1998 | Ycas et al. ......................... 360/97.01 |

FOREIGN PATENT DOCUMENTS

| | | |
|---|---|---|
| 6215530 | 5/1994 | (JP) . |
| 7245898 | 9/1995 | (JP) . |
| 408106743 | 4/1996 | (JP) . |

* cited by examiner

Primary Examiner—Neil Abrams
(74) Attorney, Agent, or Firm—Crowe & Dunlevy (57) ABSTRACT

A flex circuit support and apparatus (148) for a disc drive (100) comprising a flex circuit (150) with a conductor portion (154), a rigid dielectric support bracket (156), and a compressible, deformable resilient dielectric gasket seal (174), and extends through a connector aperture (162) of a basedeck (104). The support bracket (156) has a base portion (158) and a connector portion (160) vertically extending bi-directionally from the base portion (158). The gasket seal (174) is secured between the basedeck 104 and the support bracket (156). The connector portion 160 supports the conductor portion (154) of the flex circuit (150) and extends through the connector aperture (162). The support bracket (156) and the attached flex circuit (150) is secured to the basedeck (104) in a conventional manner through the use of fasteners (161). The flex circuit support and seal apparatus (148) conducts electrical signals between read/write heads (132) of the disc drive (100) and an electrical spring connector on a printed circuit board (152). The support bracket (156) may include a flex circuit tensioning portion (166) and a strain relief portion (168). The flex circuit (150) may be attached to stiffeners (146, 186) and to wire routing channels. The assembly may include a seal (212) having a nest portion (216) for sealingly fitting into a nesting portion (236) in the basedeck (104).

14 Claims, 4 Drawing Sheets

FLEX SUPPORT AND SEAL APPARATUS FOR A DISC DRIVE

RELATED APPLICATION

This application claims priority to Provisional Application No. 60/089,347 entitled HDA DATA FLEX EXIT SUPPORT AND SEAL, filed Jun. 15, 1998 and Provisional Application No. 60/089,344 entitled LOW INDUCTANCE FLEX-TO-PCB SPRING CONNECTOR, filed Jun. 15, 1998.

FIELD OF THE INVENTION

The present invention relates generally to the field of disc drive data storage devices, and more particularly but not by way of limitation, to a flex support and seal apparatus, the apparatus for connecting read/write head wires of a disc drive to a printed circuit board.

BACKGROUND OF THE INVENTION

Modern disc drives are commonly used in computer environments ranging from super computers through notebook computers, to store large amounts of data in a form that can be made readily available to a user. Typically, a disc drive has one or more magnetic discs that are rotated at a constant speed by a spindle motor. Each disc surface has a data recording surface divided into a series of generally concentric data tracks radially spaced across a band having an inner diameter and an outer diameter.

The data is stored within the data tracks on the disc in the form of magnetic flux transitions. The flux transitions are induced by an array of read/write heads. Each disc surface has a data recording surface divided into a series of generally concentric data tracks radially spaced across a band having an inner diameter and an outer diameter.

The data stored within the data tracks on the disc is in the form of magnetic flux transitions. The flux transitions are induced by an array of read/write heads. Typically, each data track is divided into a number of data sectors that store fixed sized data blocks.

The read/write head includes an interactive element such as a magnetic transducer that senses the magnetic transitions on a selected data track to read the data stored on the track. Alternatively, to write data to the disc surface, the read/write head transmits an electrically induced, short duration magnetic field that induces magnetic transitions on the selected data track.

In addition to the read/write heads the actuator assembly generally includes head wires, which conduct electrical signals from the read/write heads to a flex circuit that, in turn, conducts the electrical signals to a read/write channel located on the printed circuit board (PCB) of the disc drive. Normally the electrical signal paths are routed through one or more connectors en route to the read/write channel. The connectors facilitate the electrical connection between the flex circuit of the disc drive and the PCB of the disc drive. However in so doing, the contacts of the connectors typically induce added inductance and capacitance into the circuit, thereby causing a change in inductance per unit length along the signal path. This change in inductance per unit length along the signal path frequently results in a parasitic electrical degradation of the signal. Several approaches have been used to accommodate the data signal interconnect needs of a disc drive, but in general, these approaches have been silent regarding, resolution of parasitic electrical signal degradation problems caused by changes in inductance per unit length along, the signal path.

In the process of connecting the flex circuit and the PCB, one previous approach makes use of an apparatus with a three connector combination configuration. First is a flex circuit connector (the connector body housing, female connector pins) is soldered directly to the flex circuit. The second is a pass-through connector (the connector body housing male pins, the male pins having a top portion protruding from a top side of the connector body and a bottom portion protruding from a bottom side of the connector body) mounts to the basedeck with the bottom portions of the male pins extending from a slot in the basedeck. The third is a printed circuit board connector (a connector body housing female connector pins) is soldered directly to the PCB. The advantage of this configuration is that the flex circuit remains internal to the HDA.

Under this three-connector combination approach the flex circuit connector is mounted to a flex circuit mounting bracket. Then the flex circuit connector connects to the pass-through connector internal to the HDA. Contact between the flex circuit connector and the pass-through connector is maintained by physically securing the flex circuit mounting bracket and the pass-through connector to the basedeck of the disc drive. External to the basedeck the pass-through connector connects to the printed circuit board connector. The printed circuit board connector is mounted to the PCB of the disc drive, and the PCB is then fastened to the basedeck of the disc drive. Attaching the disc drive PCB to the basedeck provides the means of maintaining physical contact between the pass-through connector and the printed circuit board connector.

Another approach of forming the connection is to feed the flex circuit external to the HDA. Typically the flex circuit passes between the basedeck and a gasket mounted on the cover of the disc drive. Once the flex circuit is external to the HDA, the flex circuit commonly mates with an edge connector that is soldered to the PCB of the disc drive. The disadvantages of this external feed approach are exposure of the flex circuit to handling damage during the assembly process; in field applications; and difficulties encountered in automated production processes. The production difficulties tend to arise when trying to locate, secure and connect the non-rigid flex circuit via automated means.

Normally, under this external feed approach, the flex circuit is secured to an alignment member which lends support to the flex circuit and provides a means to maintain registration of the contact pads of the flex circuit in relation to female connector pins of a connector soldered to the PCB. The PCB of the disc drive is then fastened to the disc drive's basedeck to maintain stability of the connection. An example of an adaptation of this approach is disclosed by U.S. Pat. No. 5,403,202 issued to Donald P. Roehling (Roehling '202).

As is known in the art, quality, space constraints, mass production requirements, component costs and component performance (for both mechanical and electrical characteristics) are key factors that influence the choice of an interconnection solution to facilitate connection between the flex circuit and the disc drive PCB.

It is evident from the Roehling '202 disclosure the prominent key factor driving the signal interconnection selection was the space constraint challenges presented by disc drives of the 1.3 form factor.

In contrast to the Roehling '202 approach, the three-connector combination approach was driven by the desire to minimize the exposure of the flex circuit to handling and use damage while maximizing the interconnect configuration for automation. Under the three-connector combination approach the flex circuit is confined internal to the HDA of the disc drive, resolving the problem of exposing the flex circuit to handling and environmental damage, while use of the pass-through male pinned connector promotes ease of production.

Advancements in bit transfer rate technologies, with transfer rates in the range of one gigabit per second and the resultant pico-second range rise and fall signal time, has driven the interconnection electrical performance characteristics of the connection as the key factor of read/write signal management. Parasitic electrical signal degradation, due to changes in inductance and capacitance per unit length along the signal path, begin to dominate as the key electrical performance factor to be addressed by read/write signal interconnection technology as bit transfer rates approach the gigabit per second range.

The signal management burdens within read/write signal interconnection technology, brought about by the emergence of transfer rates in the gigabit per second range, coupled with the remaining key factors of quality, mechanical performance, space constraints, automation considerations and component costs, have collectively converged to generate an unmet need in the industry for an improved flex-to-PCB connector that minimizes the parasitic electrical signal degradation effects created by changes in inductance per unit length seen by the read/write signal along the signal path.

SUMMARY OF THE INVENTION

A flex circuit support and seal apparatus extends through a connector aperture of a basedeck, and a compressible, dielectric seal adjacent the basedeck provides a seal between the basedeck and a rigid dielectric support bracket of the flex circuit support and seal apparatus. The support bracket has a connector portion that provides support for an attached flex circuit that conducts electrical signals between a printed circuit board and read/write heads of a disc drive. The connector aperture allows passage of the connector portion with the attached flex circuit while preventing passage of the seal. The support bracket with the attached flex circuit is secured to the basedeck in a conventional manner through the use of fasteners.

DETAILED DESCRIPTION

Figure 1:
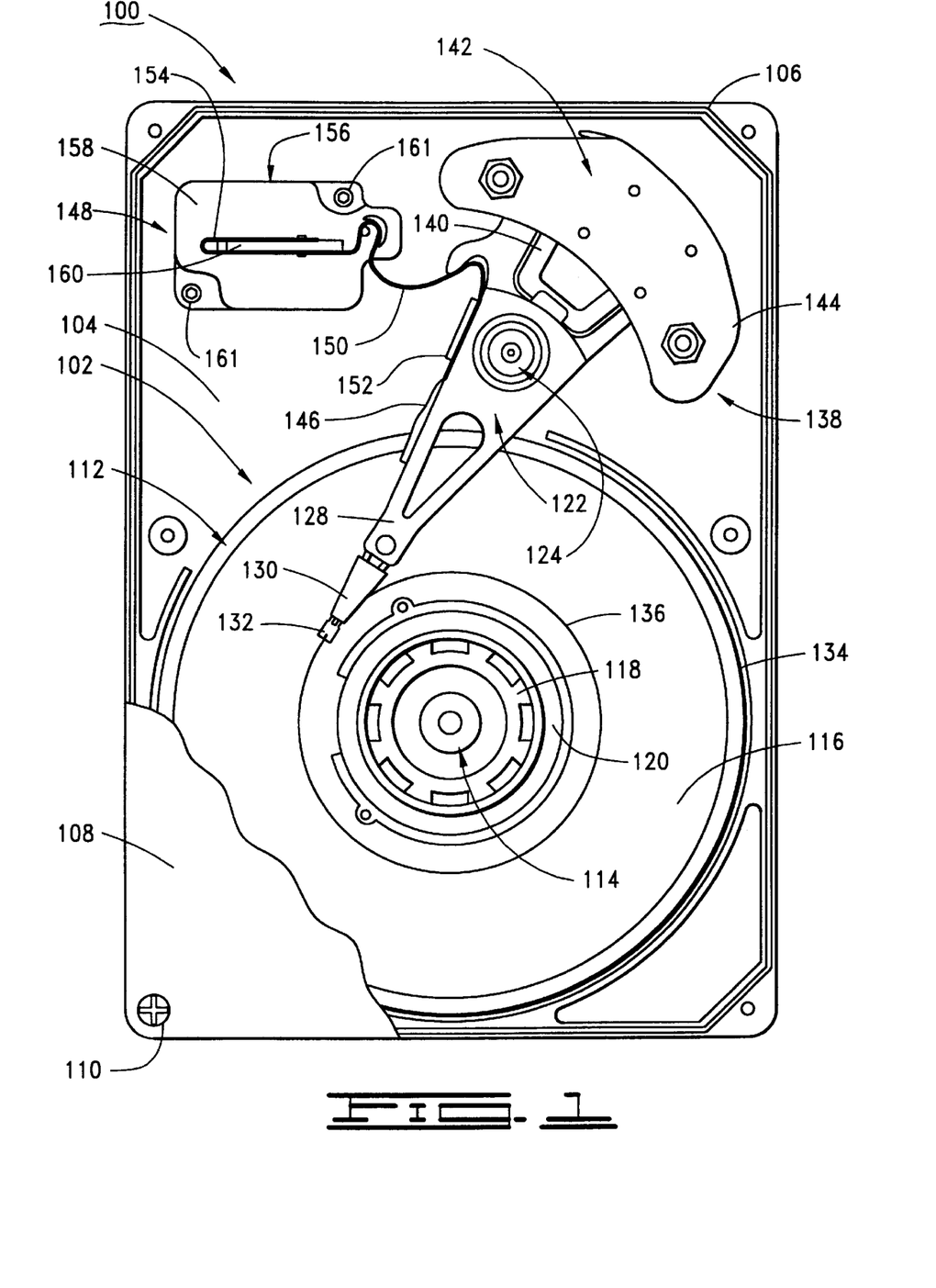
FIG. 1 is a top view of a disc drive constructed in accordance with the present invention, the top cover thereof being partially cut-away.

Referring to the drawings in general, and more particularly to FIG. 1, shown therein is a disc drive 100 constructed in accordance with the present invention. The disc drive 100 includes a head disc assembly (HDA) 102, which includes a basedeck 104 to which various disc drive components are mounted, a gasket 106, a top cover 108 (partially cutaway), and fasteners 110. Joined together the basedeck 104, gasket 106, top cover 108 and fasteners 110 (one shown) form the top portion of a hermetically sealed internal environment for the HDA 102. It will be understood that numerous details of construction of the disc drive 100 are not included in the following description as such are well known to those skilled in the art and are believed to be unnecessary for the purpose of describing the present invention.

Mounted to the basedeck 104 is a disc pack assembly 112 having a spindle motor assembly 114 with a plurality of alternately stacked discs 116 and disc spacers (not shown) disposed about a spindle motor hub 118 and secured by a clamp ring 120. Adjacent the discs 116 is an actuator assembly 122 which pivots about a cartridge bearing assembly 124. The actuator assembly 122 has a centrally disposed E-block member (not shown) on which a plurality of actuator arms 128 (one shown) are provided. The actuator arms 128 support load arm assemblies 130 which in turn support a read/write head 132, each read/write head 132 corresponding to a respective surface of one of the discs 116.

Each disc 116 has a data recording surface divided into concentric circular data tracks, (not shown), and the read/write heads 132 are positioned adjacent the data tracks to read data from, or write data to the tracks. The data tracks collectively form a data portion on the disc surface defined on its outer extremity by a guard band 134 and on its inner extremity by a landing zone 136.

The actuator assembly 122 of the disc drive 100 is pivotally positioned by a voice coil motor assembly (VCM) 138. The VCM 138 comprises an actuator coil assembly 140 supported by the E-block member and immersed in the magnetic field generated by a magnet assembly 142. The magnet assembly 142 comprises a pair of opposing magnets (not shown) each supported by a pole piece 144. The pole piece 144, constructed from a magnetically permeable material such as steel provides a flux path to complete the magnetic circuit of the VCM 138. The magnet assembly 142 is mounted to the basedeck 104 and to the top cover 108 via screws and mounting apertures 145 located in the pole piece 144.

When controlled DC current is passed through the actuator coil assembly 140, an electromagnetic field is setup which interacts with the magnetic circuit of the VCM 138 to cause the actuator coil assembly 140 to move relative to the magnet assembly 142 in accordance with the well-known Lorentz relationship.

To provide the requisite electrical conduction paths between the read/write heads 132 and disc drive read/write circuitry (not shown), read/write head wires (not separately shown) are routed on the actuator assembly 122. The read/write head wires run from the read/write heads 132 along the load arm assemblies 130 and the actuator arms 128 to a flex stiffener 146 of a flex circuit support and seal apparatus 148.

At the flex stiffener 146, the read/write head wires are soldered to corresponding conductive pads (not shown) of a flex circuit 150. The flex circuit support and seal apparatus 148 comprises the flex stiffener 146, a printed circuit board (PCB) 152, the flex circuit 150 with a conductor portion 154, a rigid dielectric support bracket 156 with a base portion 158 and a connector portion 160 bi-directionally extending vertically from the base portion 158. The flex circuit support and seal apparatus 148 is connected to the basedeck 104 in a conventional manner through the use of fasteners 161.

The conductor portion 154 of the flex circuit 150 is in contact with, and is secured by, the connector portion 160 of the support bracket 156. The base portion 158 and the connector portion 160 have a connector aperture 162 (shown in FIG. 2) for passage of the conductor portion 154 between the base portion 158 and the connector portion 160 of the support bracket 156.

Figure 2:
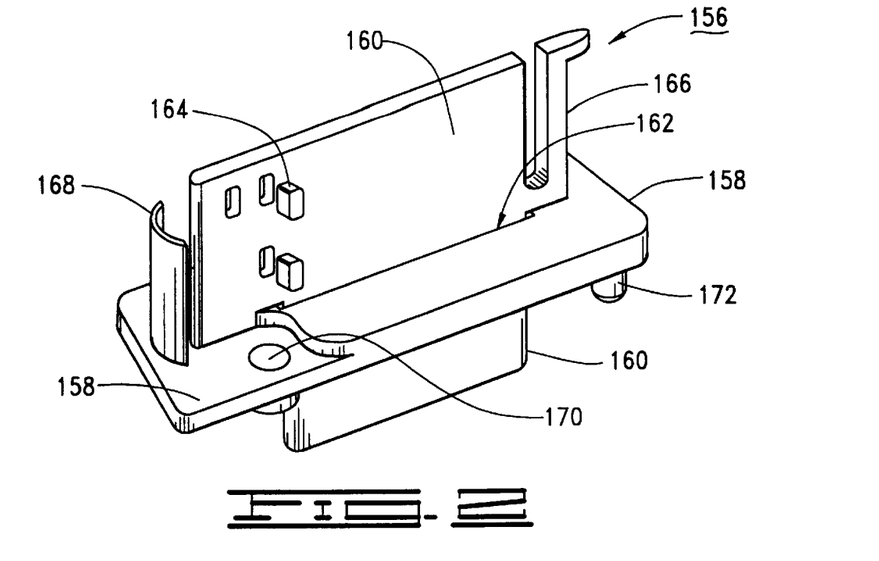
FIG. 2 is a perspective view of the rigid dielectric support bracket of FIG. 1.

FIG. 2 is a perspective view of the support bracket 156. The support bracket 156 forms the conductor aperture 162 through which the conductor portion 154 of the flex circuit 150 passes. The support bracket 156 further provides a pair of flex circuit attachment pegs 164 extending horizontally from the connector portion 160 and parallel to the base portion 158 for securing the flex circuit 150. The connector portion 160 has a self-adjusting tension portion 166 for keeping the flex circuit 150 taut when attached to the support bracket 156. The support bracket 156 also has a strain relief portion 168 vertically extending from the base portion 158 adjacent the attached flex circuit 150. Additionally, the base portion 158 has a pair of mounting apertures 170 disposed and diagonally opposed in the base portion 158 to provide means for securing the dielectric support bracket 156 to the basedeck 104 via the fasteners 161. Further, the connector portion 160 provides rigid support for the conductor portion 154 of the flex circuit 150.

The support bracket 156 forms a "t" shape configuration, the vertical member of the "t" shape comprising the connector portion 160 with the self-adjusting tension portion 166 of the connector portion 160 and the strain relief portion 168, while the base portion 158 comprises the horizontal member of the "t" configuration. The connector portion 160 has a thickness of substantially twenty times the thickness of the flex circuit 150. To complete the horizontal portion of the "t" shape configuration, the base portion 158 forms the mounting apertures 170 and provides the alignment pegs 172 extending from the base portion 158.

In forming the connector aperture 162 of the base portion 158 provides a side and ends while the connector portion 160 provides the remaining side. Preferably the mounting apertures 170 are disposed diagonally opposed each other to promote a uniform compressive force when the base portion 158 is secured to the basedeck 104 by the fasteners 161.

Figure 3:
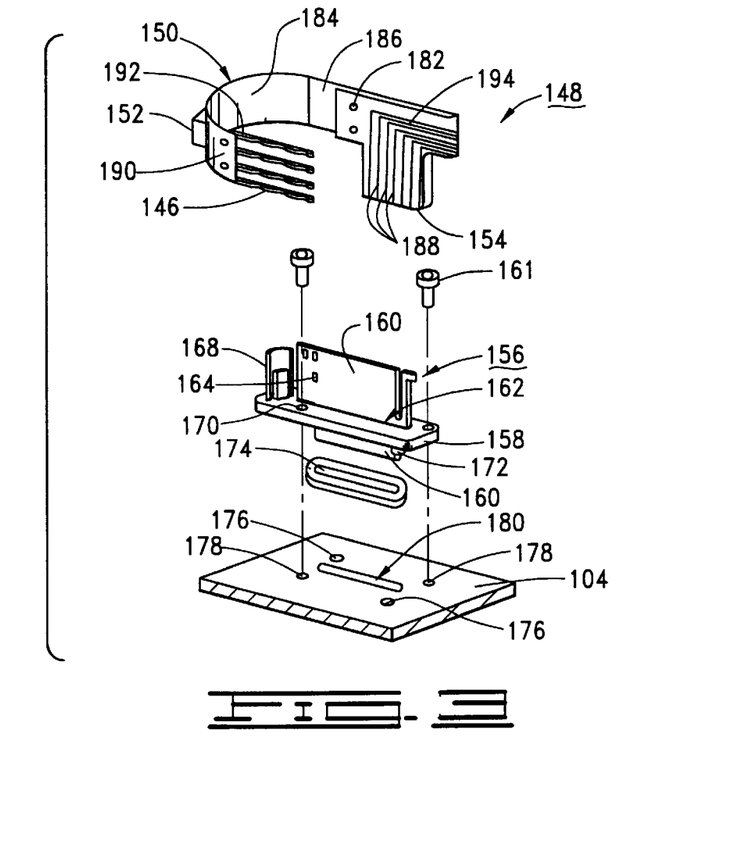
FIG. 3 is an exploded perspective view of the flex circuit support and seal apparatus of FIG. 2.

FIG. 3 is an exploded perspective view of the flex circuit support and seal apparatus 148 showing a portion of the basedeck 104, the support bracket 156, the flex circuit 150, the flex stiffener 146, the fasteners 161 and an elongated "O-ring" type resilient dielectric gasket seal 174.

The basedeck 104 has a pair of alignment apertures 176 used during the assembly process to align the support bracket 156 to the basedeck 104, and a pair of threaded containment apertures 178 that engage the fasteners 161 to secure the support bracket 156 to the basedeck 104. The basedeck 104 further forms a flex support and seal exit slot or connector slot 180 to provide passage for the connector portion 160 of the support bracket 156 with the attached conductor portion 154 of the flex circuit 150 from inside the HDA 102 to be extensibly disposed external to the HDA 102.

The flex circuit 150 has a pair of flex alignment apertures 182, a flexible dielectric carrier 184, a stiffener portion 186, conductors 188 and a lead portion 190. When assembled, the conductor portion 154 attaches to the connector portion 160; the seal gasket 174 surrounds the attached conductor portion 154 and comes to rest between the base portion 158 of the support bracket 156 and the basedeck 104. Upon passing the fasteners 161 through the mounting apertures 170, threading the fasteners 161 into the threaded containment apertures 178 and torquing the fasteners 161, the gasket seal 174 compresses and fills any voids between the basedeck 104 and the flex circuit support and seal apparatus 148 thereby sealing the connector slot 180.

The lead portion 190 has several conductive solder pads 192 as appropriate for soldering to read/write head wires (not shown) to electrically connect the read/write heads 132 to the flex circuit 150. The solder pads 192 are supported by the flex stiffener 146, the flex stiffener 146 providing wire channels (not separately shown) for routing the read/write wires to the solder pads 192. In forming the electrical connection a plurality of conductive traces 194 disposed on the flex circuit 150 serve to electrically connect the conductors 188 of the conductor portion 154 of the flex circuit 150 to the read/write heads 132 via the read/write head wires (not shown).

First ends of the read/write head wires are soldered to the read/write heads 132, and second ends of the read/write head wires are soldered to the solder pads 192 on the lead portion 190 of the flex circuit 150. The conductor portion 154 of the flex circuit 150 is supported by the connector portion 160 of the support bracket 156 and together pass through the connector slot 180 of the basedeck 104 and are extensible from the HDA 102.

Figure 4:
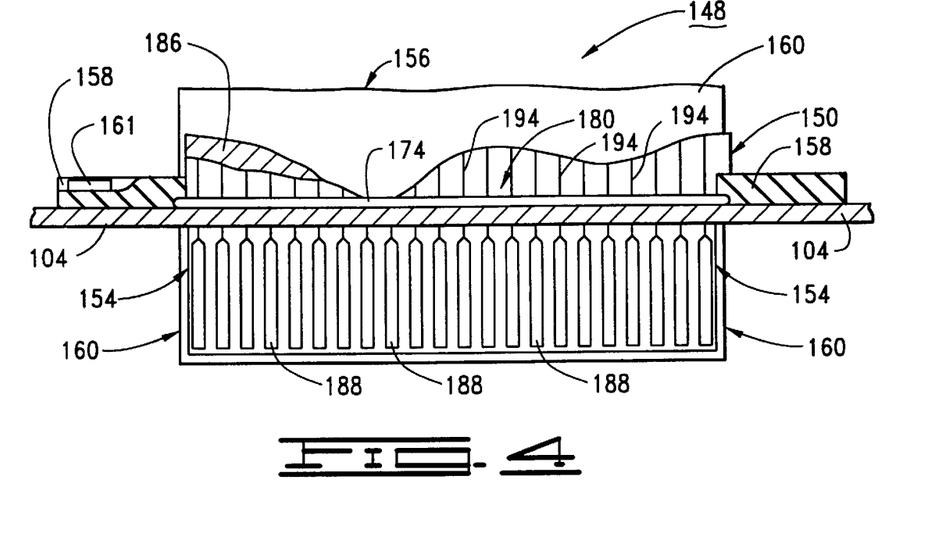
FIG. 4 is a partial cut-away view of a portion of the flex circuit support and seal apparatus of FIG. 3 mounted in the basedeck of FIG. 1.

FIG. 4 is a partial cut-away side view of the flex circuit support and seal apparatus 148 of FIG. 1, showing the connector portion 160 and the base portion 158 of the support bracket 156 along with the attached flex circuit 150. The flex circuit 150 wraps around the self-adjusting tension portion 166 and conforms to the connector portion 160. The partial cut-away view of the flex circuit 150 exposes the semi-flexible resilient dielectric stiffener portion 186 that provides rigidity for the flex circuit 150 needed to support the conductors 188 during electrical connections and facilitates the passage of the conductor portion 154 through the connector aperture 162. The partial cut-away view of the flex circuit 150 also shows the conductors 188 electrically connected to the conductive traces 194 disposed on the flex circuit. The conductive traces 194 serve to electrically connect the conductors 188 to the solder pads 192 of the lead portions, again the solder pads 192 are used for soldering the read/write head wires (not shown) in place.

As mentioned, the read/write head wires are soldered to, and interconnect the read/write heads 132 and the solder pads 192 of the flex circuit 150. The solder pads 192 are secured in place by the flex stiffener 146 while the PCB 152 attaches to the flex circuit 150 and is used to process electrical signals.

The conductor portion 154 of the flex circuit 150 is supported by the connector portion 160 of the support bracket 156 and together pass through the connector slot 180 in the basedeck 104. The flex circuit 150 together with the connector portion 160 of the support bracket 156 are surrounded by the gasket seal 174, and the gasket seal 174 remains adjacent both the basedeck 104 and the base portion 158 while the connector portion 160 with the attached conductor portion 154 extend from the internal portion of the HDA 102 by passing through the connector slot 180. FIG. 4 further shows the gasket seal 174 engaging the flex circuit 150, the support bracket 156 and the basedeck 104 to provide the bottom seal portion of the internal environment of the HDA 102.

Figure 5:
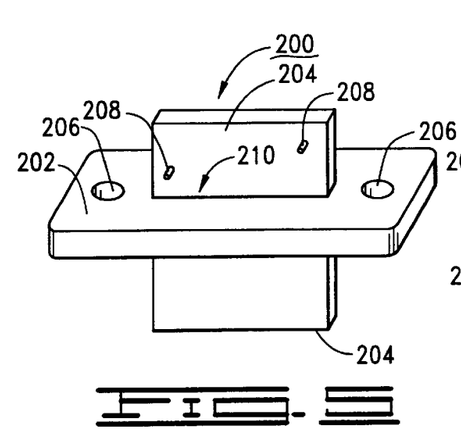
FIG. 5 is a perspective view of a second embodiment of a rigid dielectric support bracket.

FIG. 5 is a perspective view of a second embodiment of a rigid dielectric support bracket 200. The support bracket 200 has a base portion 202 and a connector portion 204, the base portion 202 providing attachment means for attaching the support bracket 200 to the basedeck 104. The base portion 202 has a pair of mounting apertures 206 for securing the support bracket 200 to the basedeck 104 via the fasteners 161.

The connector portion 204 extends bi-directionally and vertically from the base portion 202 for securing the flex circuit 150, the connector portion 204 providing a pair of attachment pegs 208 for attaching the flex circuit 150 to the connector portion 204. The attachment pegs 208 extend from the connector portion 204 parallel to the base portion 202 and are used when attaching the flex circuit 150 to the support bracket 200. The base portion 202 further forms a conductor slot 210 through which the conductor portion 154 of flex circuit 150 passes when being attached to the support bracket 200.

Figure 6:
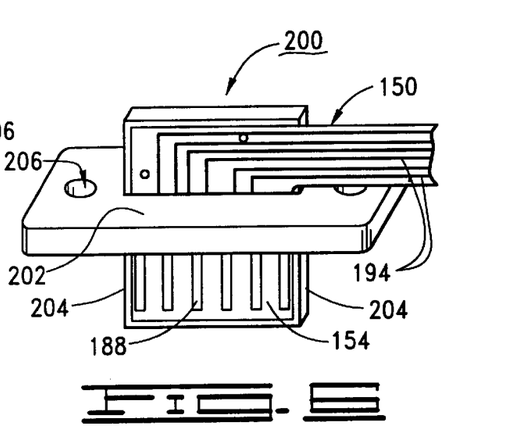
FIG. 6 is a perspective view of the support bracket of FIG. 5 with the flex circuit of FIG. 1 attached thereto.

FIG. 6 shows a perspective view of the flex circuit 150 attached to the support bracket 200. Specifically, FIG. 6 shows the attachment pegs 208 extending through appropriately sized apertures (not separately designated) as the means for securing the flex circuit 150 to the connector portion 204. Also shown is the passage of the conductor portion 154 of the flex circuit 150 through the conductor slot 210, thereby disposing the conductors 188 below the base portion 202. The conductors 188 are electrically connected to the conductive traces 194.

Figure 7:
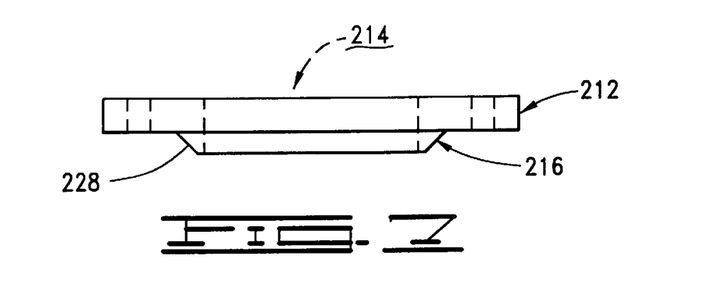
FIG. 7 is a side view of a compressible, deformable resilient dielectric seal.

FIG. 7 is a side view of a second compressible, resilient dielectric gasket seal 212. When mounted in the disc drive 100, the seal gasket 212 is adjacent to and positioned between the support bracket 200 and the basedeck 104. The gasket seal 212 forms a main body connector aperture 214 for receiving and allowing the connector portion 204 with the attached conductor portion 154 to enter and pass through. The main body connector aperture 214 of the gasket seal 212 provides and maintains a compression fit adjacent the conductor portion 154 of the flex circuit 150. The gasket seal 212 additionally provides a nesting portion 216 that conforms to the basedeck 104 and encloses the main body connector aperture 214, thereby providing the bottom seal when compressed during assembly of the HDA 102.

Figure 8:
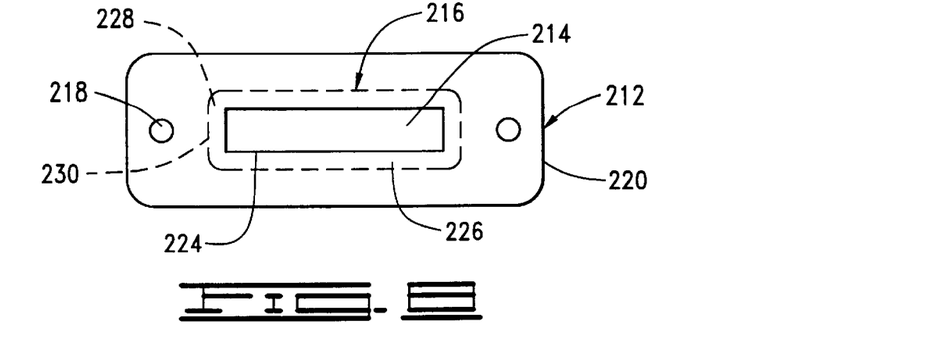
FIG. 8 is a top plan view of the resilient dielectric seal of FIG. 7.

FIG. 8 shows the gasket seal 212 a pair of two mounting apertures 218. that align with the corresponding mounting apertures 206 of the base portion 202 of the support bracket 200 and allow the passage of fasteners 161 during attachment the support bracket 200 to the basedeck 104.

Further, the gasket seal 212 has a main body portion 220 attached to the nesting portion 216. The main body portion 220 encloses the main body connector aperture 214 and has a thickness substantially equal to twenty times the thickness of the flex circuit 150. The nesting portion 216 is seamlessly attached to the main body portion 220 and also encloses the main body connector aperture 214.

The nesting portion 216 is aligned with the main body portion 220 to assure continuity and registration of the main body connector aperture 214. The nesting portion 216 comprises a base member 224, a top member 226, and an external wall 228 (also shown in FIG. 7). The top member 226 has an inner edge (not separately shown) disposed in a plane aligned parallel to the base member 224 and an outer edge 230. The internal wall extends perpendicularly from the base member 224 and terminates at the inner edge of the top member 226. It should be noted that when mounted in the disc drive 100, the internal wall is adjacent the conductor portion 154 attached to the connector portion 204.

The external wall 228 is attached to the internal wall of the nesting portion 216 at the base member 224 and extends from the base member 224 at an outwardly sloping angle terminating at the outer edge 230 of the top member 226. Regarding the external wall 228, it should be noted that when mounted in the disc drive 100, the external wall 228 is adjacent the basedeck 104.

Figure 9:
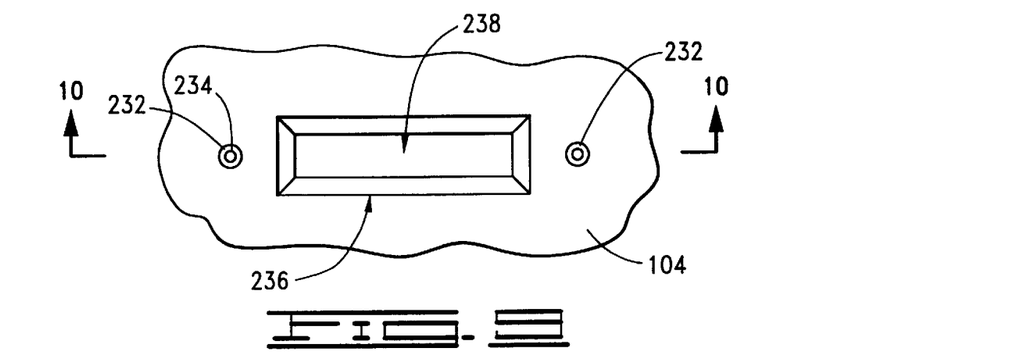
FIG. 9 is a top plan view of a portion of the basedeck of FIG. 1.

FIG. 9 shows a top plan view of a portion of the basedeck 104. The basedeck 104 provides a pair of fastener receptacle standoffs 232 wherein each receptacle standoff 232 encloses a containment aperture 234 and a basedeck nest portion 236 for receiving the nesting portion 216 of the gasket seal 212. The nest portion 236 additionally provides a flex circuit support and seal apparatus aperture or insertion slot 238 for allowing the passage of the connector portion 204 with the attached conductor portion 154 while restricting passage of nesting portion 216 of the gasket seal 212.

When mounted, the basedeck nest portion 236 of the basedeck 104 is adjacent the nesting portion 222 of the gasket seal 212 while the receptacle standoffs 232 serve to align the gasket seal 212 and control the amount of compression experienced by the gasket seal 212 to a post compression, predetermined height sufficient to develop and maintain the bottom seal of the HDA 102.

Figure 10:
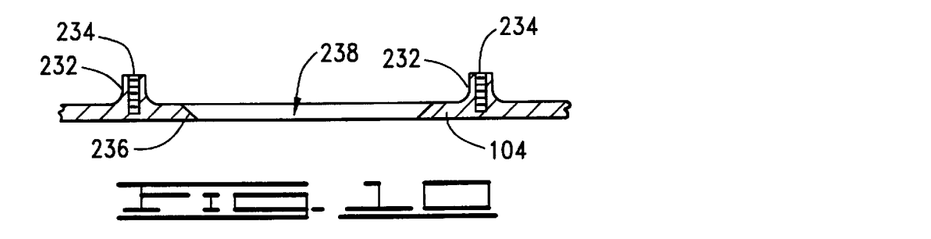
FIG. 10 is a cross-sectional view taken along line 10—10 in FIG. 9.

FIG. 10 shows the receptacle standoffs 232 and the containment apertures 234, and the basedeck nest portion 236. The basedeck nest portion 236 is configured to receive the nesting portion 216 of the gasket seal 212. Again, the basedeck nest portion 236 provides a passageway for the connector portion 204 with the attached conductor portion 154 to exit the HDA 102 via a flex circuit support and seal apparatus aperture 238. Additionally, FIG. 10 more clearly shows the receptacle standoffs 232 relative to the basedeck 104, the basedeck nest portion 236 and the flex circuit support and seal apparatus aperture 238.

Figure 11:
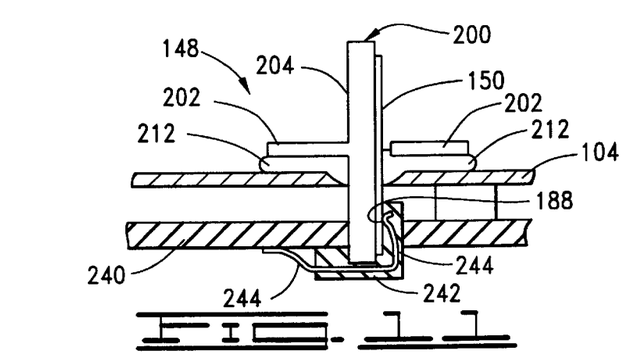
FIG. 11 is a semi-detailed, partial cut-away, partial cross-sectional view of another embodiment of a flex circuit support and seal apparatus.

FIG. 11 depicts that attached to the basedeck 104 is a printed circuit board (PCB) 240 with a single sided electrical spring connector 242 which has plural conductive spring contacts 244, that are disposed to make electrical contact with the conductors 188. The spring contacts 244 have one end soldered and attached to circuitry in the PCB 240. Thus, the flex circuit support and seal apparatus 148 is mounted to the basedeck 104 and plugged into the spring contacts 244 of the PCB 240 to provide electrical connection to the disc drive 100.

The electrical connection made between the spring contacts 244 of the single sided electrical spring connector 242 and the conductors 188 (not separately shown in FIG. 11) of the flex circuit 150 substantially form a continuous signal path of uniform electrical characteristics by maintaining uniformity in the capacitance and inductance of the signal path over the entire length of the signal path, thereby minimizing the parasitic electrical signal degradation effects created by changes in capacitance and inductance per unit length seen by the read/write signal along the signal path. The PCB 240 is secured to the basedeck 104 through the use of conventional fasteners (not shown).

A flex circuit support and seal apparatus (such as 148) extends through, a connector aperture (such as 162) in a basedeck (such as 104) for attachment of a flex circuit (such as 150) in a disc drive (such as 100). The flex circuit support and seal apparatus has a rigid dielectric support bracket (such as 156) extensive through the connector aperture, and a compressible, deformable resilient dielectric gasket seal (such as 174) is disposed adjacent the basedeck for providing a seal between the basedeck and the support bracket. The support bracket provides support for an attached flex circuit that conducts electrical signals between a printed circuit board (such as 240) and read/write heads (such as 132) of the disc drive. The flex circuit support and seal apparatus (such as 148) is secured to the basedeck in a conventional manner through the use of fasteners (such as 161) attaching the support bracket with the attached flex circuit to the basedeck.

It will be clear that the present invention is well adapted to carry out the objects and attain the ends and advantages mentioned as well as those inherent therein. While a presently first and second embodiment have been described for purposes of this disclosure, numerous changes may be made which will readily suggest themselves to those skilled in the art and which are encompassed in the spirit of the invention disclosed and as defined in the appended claims.

What is claimed is:

1. A flex circuit support and seal apparatus for supporting and interconnecting conductors on a flex circuit to contacts associated with a printed circuit board, the printed circuit board supported on a basedeck of a disc drive, the basedeck having a connector aperture, the flex circuit support and seal apparatus comprising:

a dielectric support bracket extending through the connector aperture of the basedeck and supporting the conductors of the flex circuit to engage the contacts associated with the printed circuit board;

a dielectric seal adjacent the dielectric support bracket sealing the connector aperture; and a fastener to attach the dielectric support bracket to the basedeck.

2. The flex circuit support and seal apparatus of claim 1 wherein the basedeck further forms at least one alignment aperture and at least one containment aperture and the flex circuit comprises a semi-flexible dielectric backing portion affixed to the conductor portion to provide support for electrical connections.

3. The flex circuit support and seal apparatus of claim 2 wherein the dielectric support bracket has a base portion and connector portion vertically extensible through the base portion, the connector portion having a self adjusting tension portion for keeping the attached flex circuit taut, the conductor portion provides at least one flex circuit attachment peg for attaching the flex circuit to the dielectric support bracket, the conductor portion and base portion further forming a conductor slot, the base portion forms at least one mounting aperture disposable above the basedeck, at least one alignment peg vertically extending from the base portion also disposable above the basedeck and a strain relief portion vertically extending from the base portion adjacent the attached flex circuit, the base portion attaching to and enclosing the connector portion.

4. The flex circuit support and seal apparatus of claim 3 wherein the flex circuit is adjacent the self adjusting tension portion, the connector portion and the strain relief portion, the flex circuit having at least one flex attachment aperture for securing the flex circuit to the dielectric support bracket by the attachment peg, the flex circuit further comprising:

a lead portion having solder pads;

at least one conductor portion with attached conductors and conductive traces for conducting electrical signals, the conductor portion extensible through both the conductor slot and the connector aperture of the basedeck; and a flex stiffener adjacent the lead portion of the flex circuit to support the solder pads of the lead portion, the conductors contacting the contacts associated with the printed circuit board for processing electrical signals.

5. The flex circuit support and seal apparatus of claim 4 wherein fasteners extend through the mounting apertures to engage the containment apertures and compressing the dielectric seal between the dielectric support bracket and the basedeck forming the hermetic seal.

6. The flex circuit support and seal apparatus of claim 1 wherein the dielectric support bracket has a mounting aperture and wherein the dielectric seal is made from a compressible, deformable material and comprises:

a main body portion forming a connector aperture and at least one mounting aperture adjacent the mounting aperture of the dielectric support bracket, the main body portion having a thickness about twenty times the thickness of the flex circuit; and a nesting portion attached to the main body portion and forming a connector aperture.

7. The flex circuit of support and seal apparatus of claim 6 wherein the basedeck has a nest portion forming the connector aperture for receiving the nesting portion of the dielectric seal.

8. The flex circuit support and seal apparatus of claim 7 wherein the basedeck further forms a connector aperture, at least one alignment aperture and at least one containment aperture and the flex circuit comprises a semi-flexible dielectric backing portion affixed to the conductor portion to provide support for electrical connections.

9. The flex circuit support and seal apparatus of claim 8 wherein the dielectric support bracket has a base portion and connector portion vertically extensible from the base portion, the connector portion having a self adjusting tension portion for keeping the attached flex circuit taut, the conductor portion has at least one flex circuit attachment peg for attaching the flex circuit to the dielectric support bracket, the base portion forming at least one mounting aperture disposable above the basedeck, at least one alignment peg vertically extending from the base portion and disposable above the basedeck and a strain relief portion vertically extending from the base portion adjacent the attached flex circuit, the base portion attaching to and enclosing the connector portion.

10. The flex circuit support and seal apparatus of claim 9 wherein the flex circuit is adjacent the self adjusting tension portion, the connector portion and the strain relief portion, the flex circuit forming at least one flex attachment aperture for securing the flex circuit to the dielectric support bracket by means of the attachment peg, the flex circuit further comprising:

a lead portion having solder pads;

at least one conductor portion with attached conductors and conductive traces for conducting electrical signals, the conductor portion extensible through both the conductor slot and the connector aperture of the basedeck;

a flex stiffener adjacent the lead portion of the flex circuit to support the solder pads of the lead portion; and a flex circuit printed circuit board attached to the flex circuit for processing electrical signals.

11. The flex circuit support and seal apparatus of claim 10 wherein the fasteners further extend through the mounting apertures and engage the containment apertures to compress the dielectric seal between the dielectric support bracket and the basedeck to form a seal thereat.

12. A disc drive having a head-disc assembly attached to a printed circuit board by a flex circuit support and seal apparatus, the printed circuit board having a flex-to-printed-circuit-board connector, the flex circuit support and seal apparatus comprising:

a basedeck having a connector aperture therethrough;

a resilient dielectric seal adjacent the connector aperture;

a dielectric support bracket adjacent the dielectric seal, the dielectric support bracket having a base portion, a conductor portion vertically extending bi-directionally from the base portion and a conductor slot extending through the base portion adjacent to the conductor portion, a strain relief portion, a self adjusting tension portion and forming at least one mounting aperture;

a flex circuit attached to the dielectric support bracket adjacent the self adjusting tension portion and the strain relief portion, the flex circuit having at least one flex alignment aperture, a lead portion and at least one conductor portion, the conductor portion attached to the connector portion of the dielectric support bracket and extending through the connector aperture of the basedeck;

a flex stiffener adjacent the lead portion of the flex circuit; and at least one fastener securing the dielectric support bracket with the attached flex circuit to the basedeck while compressing the dielectric seal between the dielectric support bracket and the basedeck, and wherein the conductor portion forms an electrical connection with the flex-to-printed-circuit-board connector.

13. The disc drive of claim 12 wherein the dielectric seal comprises:

a main body portion forming a main body connector aperture and at least two mounting apertures adjacent the mounting apertures of the dielectric support bracket, the main body portion; and a nesting portion attached to the main body portion enclosing the main body connector aperture.

14. The disc drive of claim 13 wherein the basedeck further has a nest portion forming a connector aperture and the connector aperture aligned with the main body connector aperture, the connector aperture allowing the passage of the connector portion with attached conductor portion.

* * * * *

UNITED STATES PATENT AND TRADEMARK OFFICE
CERTIFICATE OF CORRECTION

PATENT NO. : 6,168,459 B1  Page 1 of 1
DATED : January 2, 2001
INVENTOR(S) : Alvin E. Cox, Steve S. Eckerd and Housan Dakroub It is certified that error appears in the above-identified patent and that said Letters Patent is hereby corrected as shown below:

Column 1,
Line 65, replace "regarding, resolution" with -- regarding resolution --.
Line 67, repalce "along , the" with -- along the --.

Column 2,
Line 4, replace "body housing, female" with -- body housing female --.

Signed and Sealed this

Nineteenth Day of March, 2002

Attest:

JAMES E. ROGAN
Attesting Officer   Director of the United States Patent and Trademark Office